(12) United States Patent
Warren

(10) Patent No.: US 7,159,199 B2
(45) Date of Patent: Jan. 2, 2007

(54) METHOD FOR VERIFYING ADEQUATE SYNCHRONIZATION OF SIGNALS THAT CROSS CLOCK ENVIRONMENTS AND SYSTEM

(75) Inventor: Robert Warren, Bristol (GB)

(73) Assignee: STMicroelectronics Limited (GB)

( * ) Notice: Subject to any disclaimer, the term of this patent is extended or adjusted under 35 U.S.C. 154(b) by 207 days.

(21) Appl. No.: 10/816,799

(22) Filed: Apr. 2, 2004

(65) Prior Publication Data

US 2005/0229127 A1 Oct. 13, 2005

(51) Int. Cl.
*G06F 17/50* (2006.01)
(52) U.S. Cl. .................... 716/6; 716/4; 716/5
(58) Field of Classification Search ............ 716/6, 716/5, 4, 1
See application file for complete search history.

(56) References Cited

U.S. PATENT DOCUMENTS

| | | | |
|---|---|---|---|
| 5,796,995 A * | 8/1998 | Nasserbakht et al. | 713/503 |
| 6,353,906 B1 * | 3/2002 | Smith et al. | 714/741 |
| 6,424,189 B1 * | 7/2002 | Su et al. | 327/141 |
| 6,473,439 B1 * | 10/2002 | Zerbe et al. | 370/503 |
| 2004/0066870 A1 * | 4/2004 | Gabara et al. | 375/354 |

\* cited by examiner

*Primary Examiner*—Sun James Lin

(57) ABSTRACT

The present invention is directed to methods for verifying adequate synchronization of signals that cross clock environments. According to one exemplary method, a circuit under design includes a plurality of functional elements and a plurality of clock environments, and has one or more signals passing from one clock environment to another therein. The method includes the steps of (i) modelling at least one of the functional elements to have an unknown state as an output for a predetermined time after a timing event of a clock signal, (ii) simulating the circuit, and (iii) determining which functional element is a synchronizer to thereby identify if there is a synchronization problem for a signal passing from one clock environment to another.

21 Claims, 5 Drawing Sheets

METHOD FOR VERIFYING ADEQUATE SYNCHRONIZATION OF SIGNALS THAT CROSS CLOCK ENVIRONMENTS AND SYSTEM

FIELD OF THE INVENTION

The present invention relates to a method for verifying that there exists adequate synchronisation of signals that cross clock environments.

BACKGROUND OF THE INVENTION

Many integrated circuits or "chips" go into production and exhibit intermittent failure. If digital circuits are designed to use entirely synchronous logic, with only one clock, synchronisation issues are generally trivial. However, in the world of digital circuit design, designers are more often required to create multi-clock designs. Multi-clock implies that the design has at least two clocks, but possibly many more clocks, that are asynchronous. These digital designs will include at least one, though probably multiple signals that cross the boundaries between clock environments. If these signals are not adequately synchronised then the circuit will develop errors.

There are tools currently available that are designed to verify that timing constraints are met in a digital circuit when it is being designed and verified. These tools may be applied where there is a block of synchronous logic. However, they are impractical when there are multiple asynchronous clocks within a circuit as there are an infinite number of possible clock timings that must be evaluated.

If data is transferred from one clocked environment to another, then there may be signals that return to the original environment, perhaps in a handshake arrangement. These signals verify that data has been correctly received. All of these signals will also need to be adequately synchronised. It is possible that some signals that cross clock boundaries do not need synchronisation if they are controlled by another signal that has been synchronised.

Once a circuit has been designed it is important that it is tested to ensure that there is adequate synchronisation to avoid the propagation of metastable states through the circuit. Typically, the circuits are very large and so computer simulation methods are used to verify the design of the circuit. There are two techniques which are used for analysing circuits—firstly, dynamic timing analysis using fully timed simulation, and secondly, static timing analysis. However, neither technique is appropriate for determining if there is adequate synchronisation. Formal methods and/or property checking methods again, at present, do not provide useful information. This is because the amount of computer resource required would be much more than would be reasonable to use. In other words, these methods suffer from the problems that they are not practical, not commercially viable and/or do not provide the required results.

SUMMARY OF THE INVENTION

It is an aim of embodiments to address one or more of the problems discussed.

According to one aspect of the present invention a method of testing a circuit under design is provided having a plurality of functional elements and having a plurality of clock environments, at least one signal passing from one clock environment to another in said circuit, said method comprising the steps of modelling at least one of the functional elements to have an unknown state as an output for a predetermined time after a timing event of a clock signal, simulating said circuit and determining which of said functional elements is a synchroniser to thereby identify if there is a synchronisation problem between for said at least one signal passing from one clock environment to another.

Embodiments of the present invention are arranged to address the problem of determining if a circuit has adequate synchronisation.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF DRAWINGS

For a better understanding of the present invention and as to how the same may be carried into effect, reference will now be made by way of example to the accompanying drawings, in which like reference numerals represent like parts, and in which:

FIG 1b shows a timing diagram for the circuit of FIG 1a;

FIG. 2b shows a timing diagram for the circuit of FIG. 2a;

FIG. 5b illustrates a timing diagram showing modifications to first and second synchronisers of FIG. 5a.

DETAILED DESCRIPTION OF THE INVENTION

FIG. 1a–5b discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged image processing system.

Figure 1A:
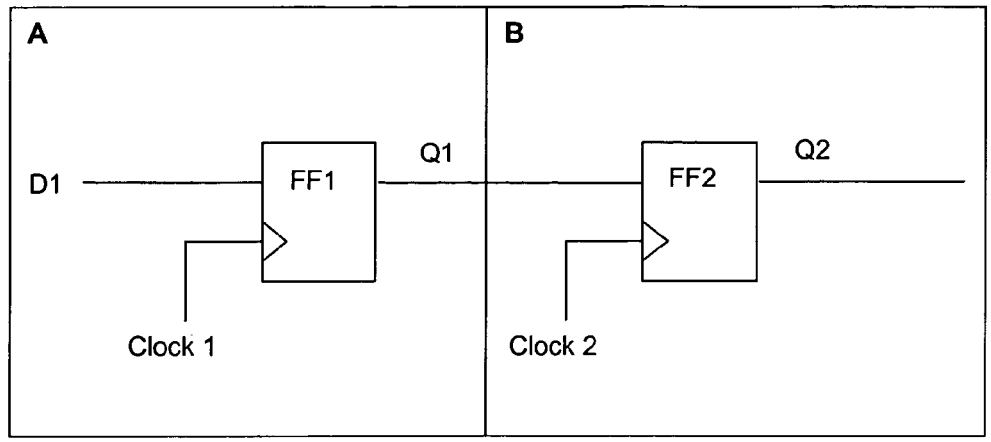
FIG 1a shows a circuit having two clock environments.

Reference is made firstly to FIG 1a, which shows an example of a circuit where inadequate synchronisation may cause errors. In the example, the signal Q1 crosses a boundary between two clock environments A and B. Two clocks (Clock 1 and Clock 2) are used to control basic synchronous memory storage devices, in this case D flip-flops FF1 and FF2. Clock 2 is asynchronous to Clock 1, that is to say that it has a clock source that is independent from the clock source that is used to derive Clock 1. Although there may be a nominal relationship between the characteristics of the two clocks and their respective periods, and also some nominal phase relationship between the two clocks, these relationships are subject to varying physical effects. In this example the nominal period of Clock 2 is greater than Clock 1, and therefore there will be a varying and indeterminate time difference between the rising clock edges of Clock 1 and the rising clock edges of Clock 2. In another example, however, Clock 1 and Clock 2 might have the same nominal period but be out of phase with each other, or have an indeterminate and varying phase relationship.

Figure 1B:
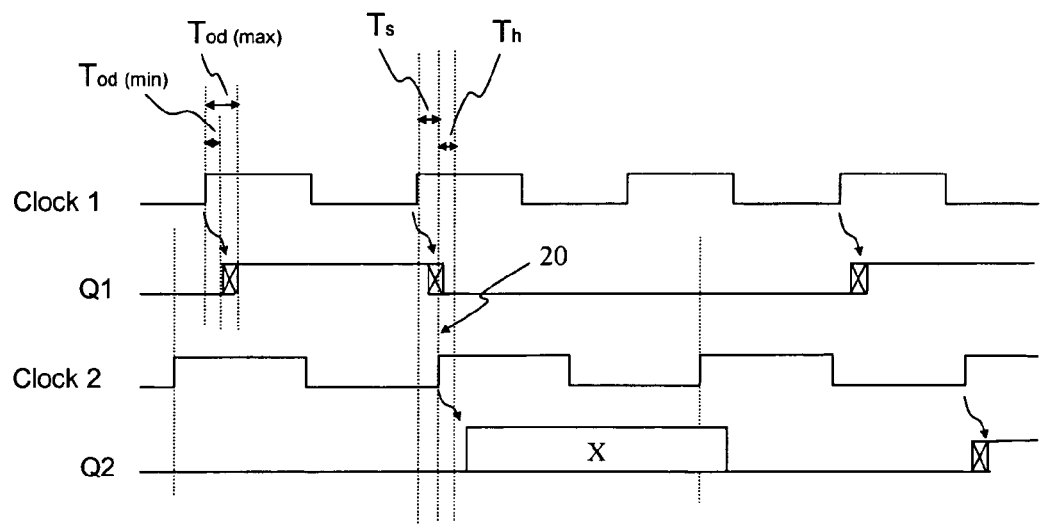

Reference is now made to FIG. 1b which shows the timing signals for the circuit of FIG. 1 in the case where a synchronisation error may occur. If there is a change, for example from 1 to 0 or from 0 to 1, in the input to the first flip-flop FF1, then the output of the first flip-flop FF1, labelled Q1, will change shortly after the rising clock edge of the first clock, Clock 1. The time taken for this change to be fully effected is known as the output delay time, which, when FF1 is operating within its specified limits, will have a value between a maximum time Tod (max) and a minimum time Tod (min) after the rising clock edge. Although the transition is a clean transition, from 0 to 1 or from 1 to 0, the precise timing of this transition cannot be determined and for this period, the signal Q1 may be described as undefined and given the label 'X'.

If the signal Q1 is undefined at anytime after the specified setup time, $T_s$, before the rising clock edge of Clock 2 and after the specified hold time, $T_h$, after the rising edge of Clock 2, as shown at 20, then the second flip-flop FF2 operates outside its specified limits and one such abnormal behaviour is described as the metastable state. The result of FF2 entering the metastable state is that its output Q2 may change either from 0 to 1, or from 1 to 0, at any time between $T_{od}$(min) and any time thereafter with a probability decreasing to zero as the time of the transition extends to infinity. Although the transition is a clean transition, from 0 to 1, or 1 to 0, the precise timing of this transition cannot be determined and for this period of indeterminable value, the signal Q2 may be described as undefined and given the label 'X'. Any subsequent logic using the signal Q2 will receive an undefined value, which may transition cleanly but at an indeterminate time, and further subsequent flip-flops may therefore also become metastable. Once one component of a digital circuit enters metastability, the consequence may be circuit failure in some or all of the digital circuit. The problem is that it is unclear what states various logic elements will be in and at that point the behaviour of the circuit will be unpredictable which is clearly undesirable.

A manufacturer of integrated circuits which include digital components such as D flip-flops might provide a setup time ($T_s$) and a hold time ($T_h$) associated with each component. In order to avoid metastability in this example, the input signal Q2 must not change during the time interval bounded by $T_s$ before the rising clock edge of clock 2, and a time $T_h$ after said rising clock edge.

Figure 2A:
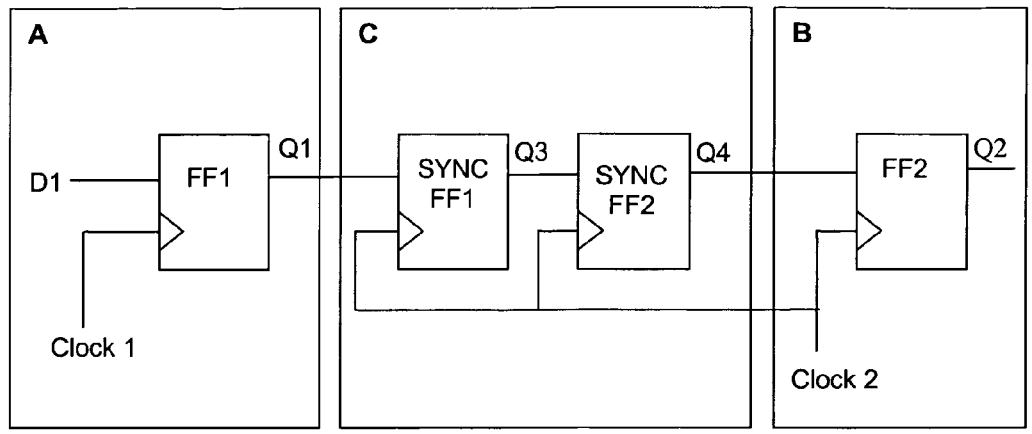
FIG. 2a shows a circuit in which a synchronisation stage is provided.

Reference is now made to FIG. 2a, which shows an example of a commonly accepted solution to the problem of metastability. In the example, two flip-flops SYNC FF1 and SYNC FF2 are positioned in series to create a 'synchronisation stage' C between the two clock environments A and B which are as described in relation to FIG 1a and will not be described again in detail. The synchronisation stage receives the output Q1 of the first flip-flop FF1 as an input to the first synchronisation flip-flop SYNC FF1 which receives the second clock signal, clock 2, as its clock signal. The output Q3 of the first synchronisation flip-flop Q3 is input to the second synchronisation flip-flop SYNC FF2 which also receives the second clock signal, Clock 2 as its clock input. The output Q4 of the second synchronisation flip-flop SYNC FF2 is input to the second flip-flop FF2 of the second clock environment.

Generally the signal Q4 will always be stable and may be used as a synchronised signal in clock environment B.

Figure 2B:
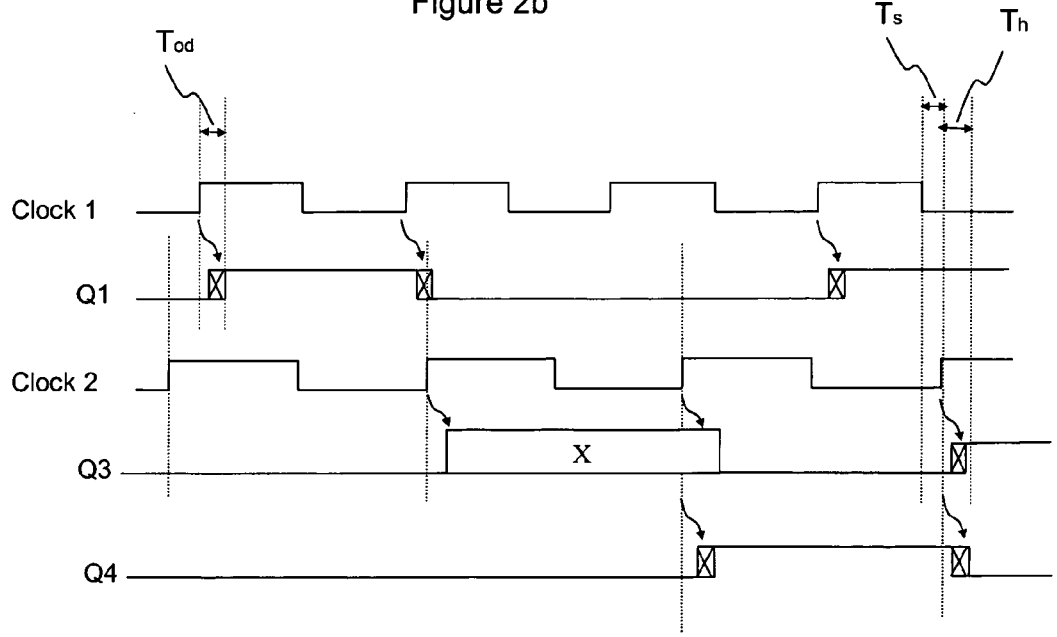

FIG. 2b shows a timing diagram for the circuit of FIG. 2a, and illustrates an example of the synchronisation error correction. As in the previous example, the worst case is chosen when second clock signal, Clock 2, rises whilst the output Q1 of the first flip-flop FF1 is unstable. The result is that the output Q3 of the first synchronisation flip-flop FF1 is undefined (that is the timing of the clean transition from 1 to 0 is indeterminable) and, with decreasing probability for longer periods of Clock 2, may not transition at all until after a subsequent rising edge of Clock 2. If output Q3 of the first synchronisation flip-flop SYNC FF2 is now fed into the second synchronisation flip-flop SYNC FF2, and the positive clock edge of the second clock signal, Clock 2 comes at a time when the output Q3 of the first synchronisation flip-flop SYNC FF1 does not transition inside the limits of $T_s$ and $T_h$, then the output of the second synchronisation flip-flop SYNC FF2, Q4, will change within its specified limits of $T_{od}$(min) and $T_{od}$(max). This output may then be used in the second clock environment B without problems of metastability.

It will be appreciated that the second synchronisation flip flop SYNC F2 could in turn become metastable. However, the probability of this is considerably reduced. In practical circuits, the number of synchronisation flip-flops is adjusted according to the clock frequency of Clock 2 and according to other factors such as the risks and impact of circuit failure. It could be necessary to have three or more synchronisation flip-flops across a clock boundary for adequate synchronisation.

It should also be appreciated that although the output of the second synchronisation flip flop SYNC FF2, Q4, may be considered safe, that is changes within the specified limits of $T_{od}$(min) and $T_{od}$(max) with an acceptable probability, the precise clock edge following which a transition of the output, Q4, occurs is indeterminate. This indeterminism can easily be handled in a digital circuit by arranging some form of feedback or handshake back to the originating clock environment, A. Again, any such feedback will also require synchronisation.

Embodiments of the invention may be arranged to verify RTL register transfer level representation of a circuit and in particular to check that the circuit has sufficient synchronisation to avoid a metastable or unknown state from propagating through a circuit. The RTL representation of a circuit is synthesised to produce a gate level representation of the circuit. It should be appreciated that other embodiments of the invention can use other representations of a circuit which may or may not be at a gate level. In embodiments of the invention, the representation of the circuit may be mapped to a cell library which contains models of known entities.

Figure 3:
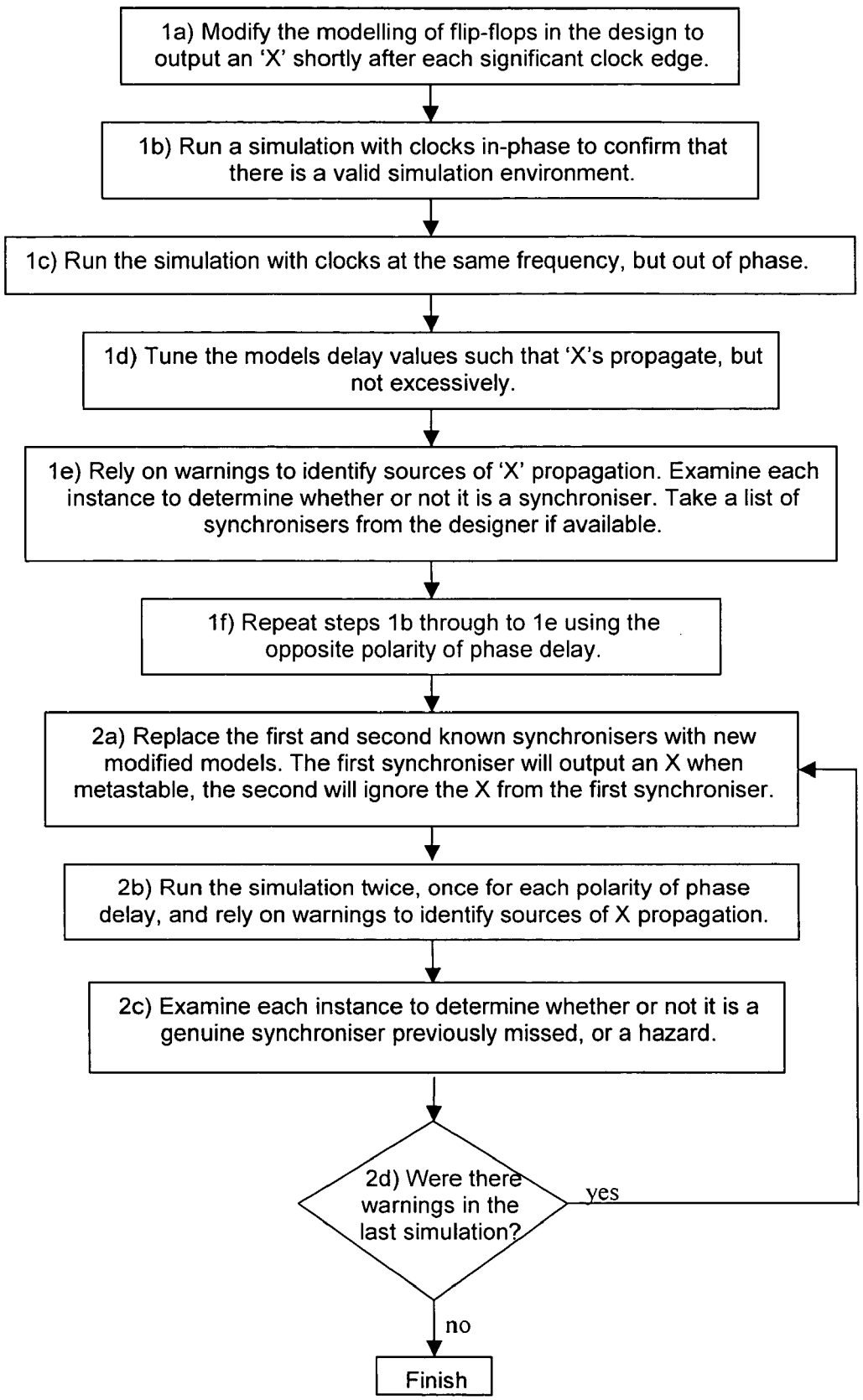
FIG. 3 illustrates by a flow diagram of a method embodying the present invention.

Referring now to FIG. 3, steps 1a to 1f describe the first phase of an embodiment of the present invention; steps 2a to 2d describe the second phase of an embodiment of the present invention.

During the first phase synchroniser flip-flops within the design are located. The first step is to modify the modelling of all of the flip-flops within the design such that they output an "X" shortly after each positive clock edge. In this embodiment of the invention, the flip-flops are arranged to change state in response to a positive clock edge. However in alternative embodiments, the element in question which may or may not be a flip-flop may be responsive to a falling clock edge or even to both the rising and falling edges. The clock edge or edge to which the element is responsive is referred to as the significant clock edge.

In the embodiment described now, the significant clock edge is the rising or positive clock edge. The outputs of the flip-flops are modelled to have an "X" state (that is an unknown state which could be high or low) in response to each significant clock edge. The "X" state is arranged to last for a predetermined time after the significant clock edge. This predetermined time is a matter of design choice but is usually half a clock period or round about that value. Thus at a delay time $T_{od}$ after the rising edge of the clock signal, the flip-flop's output value is changed to 'X' for half a clock period after the rising clock edge.

The next step 1b is to run the simulation with all the clocks in-phase and at the same frequency. This is important to ensure that the simulation environment is valid. If the simulation does not pass when all the clocks are in-phase, then it can be determined that there is a problem with the circuit design or simulation environment, in which case the next step is to return to step 1a after making the necessary corrections. It is assumed that the simulation environment includes some mechanism that can be used to determine correct functionality and indicate a pass.

The next step is step 1c where the simulation is run again. This time the clock frequencies are the same but the clocks are out of phase. In this case, it is not expected that the simulation would pass. A pass at this stage would indicate a problem with the simulation environment, in which case start again at 1a after making the necessary corrections. Examine the simulation output and determine the extent of "X" propagation.

The next step is step 1d of phase one. In this step, the model delay values are tuned such that the "X" values propagate but not excessively. It should be observed that "X" values propagate across the clock boundaries and thence to the connected logic. If "X" values cannot be traced to a signal crossing a clock boundary, then adjust the clock phase delay or reduce the duration of the "X" for the predetermined time after the significant clock edge and repeat from step 1c.

The next step of phase one is step 1e. In this step, use is made of the warnings which are generated when the simulation is run again with the tuned delay values. A warning is generated by the tool running the simulation if a potential timing problem is detected. Each of these warnings needs to be examined to see if the cause of the warning is a synchronising element. This process can be simplified if a list of those elements which provide a synchronising function are available. The designer of the circuit may for example be arranged to provide such a list.

In order to ensure that all synchronisers in each direction across the clock boundary can be traced, in the final step 1f of phase one, steps 1c through to 1e are repeated using the opposite polarity of phase delay. That is to say, if Clock 2 was previously out of phase with Clock 1 by a time difference of 't' nanoseconds after Clock 1, the steps should now be repeated with Clock 2 out of phase with Clock 1 by a time difference of 't' nanoseconds before Clock 1.

The second phase of the method will now be described. In step 2a, first and second synchronisers (for example as shown in FIG. 2a and referenced as SYNC FF1 and SYNC FF2) are replaced by new modified models. The first synchroniser will output an "X" when in the metastable state, that is for a predetermined time after the occurrence of the significant clock edge. This time is a matter of design choice, but should be in the region of one clock period. The first synchroniser will be in the metastable state if its input is undefined at any time during the time $T_s$ before and the time $T_h$ after the rising clock edge of Clock 2, and if the input shortly before and shortly after the 'X' value are different, that is to say there has been a change from 0 to 1, or from 1 to 0. When not in the metastable state, the first synchroniser will also still output "X" for a shorter period in the range of half a clock period after each rising clock edge.

The second synchroniser will ignore the "X" received from the first synchroniser. In other words the "X" generated by the first synchroniser is not propagated by the second synchroniser. The second synchroniser will also continue to output an "X" value for a period after each rising clock edge.

In the second step 2b of the second phase, the simulation is run twice, once for each polarity of phase difference. For this simulation, the clocks continue to have the same frequency and are out of phase, and test input signals are generated, such that logic transitions propagate through the circuit devices. As described above with relation to step 1f, each polarity of phase difference is simulated such that if during the first simulation Clock 2 is out of phase with Clock 1 by a time difference of 't' nanoseconds after Clock 1, simulation should also be performed with Clock 2 out of phase with Clock 1 by a time difference of 't' nanoseconds before Clock 1. Warnings which are generated by the tool running the simulation are used to identify sources of "X" propagation.

In the third step 2c of the second phase, each of the sources of the "X" propagation is examined to determine whether or not it is a genuine synchroniser which has previously been missed or a hazard.

In the fourth step 2d, it is determined if there were any warnings in the last simulations from steps 2b and 2c which are due to a missed synchroniser. If so, then the second phase is repeated. If not, the process is finished.

It should be appreciated that if hazards are identified, the hazards can be examined further and if necessary, the design modified. A hazard is defined as an entity which propagates a metastable or unknown state "X" through a circuit.

To illustrate the method embodying the present invention, one example of a circuit under test will be discussed. Thus, what follows is a demonstration of an implementation of the present invention with one example of a circuit. It should be understood that this is only an example of a very simplified circuit and that the method described may be applied to a multitude of digital circuit types and designs.

Figure 4A:
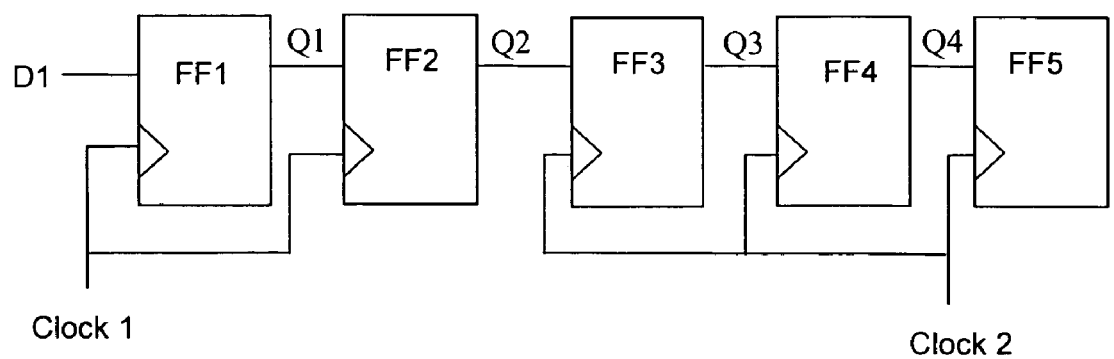
FIG. 4a shows an example digital circuit to illustrate an embodiment of the invention.

Referring to FIG. 4a, a circuit is shown which comprises five D-type flip-flops FF1, FF2, FF3, FF4 AND FF5 arranged in series. In this case the clock environment boundaries are taken as unknown and the synchronisation flip-flops are not distinguished from other flip-flops. There are two clocks, Clock 1 and Clock 2 which are at different frequencies. It will now be demonstrated how the synchronisation flip-flops may be located.

Firstly it must be understood that methods embodying the present invention are useful in verifying adequate synchronisation in a circuit when analysed at gate level. The circuit may have been designed in HDL (Hardware description language) or any other design language which is expected to be synthesised such that the circuit is given a representation at gate level, and may then be simulated at gate level using an appropriate simulation tool. Examples of HDL are Verilog and VHDL. A simulation should be performed as a first step with clocks in-phase in order to confirm that there is a valid simulation environment.

Figure 4B:
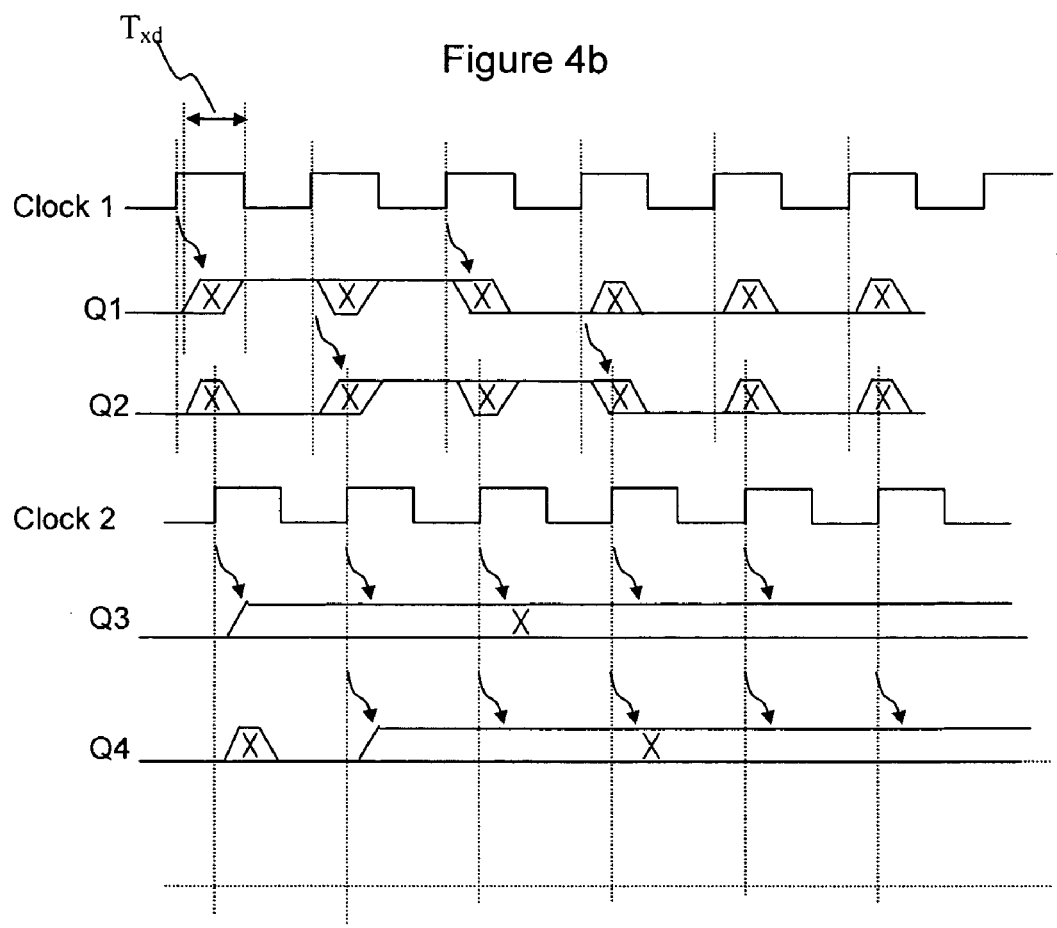
FIG. 4b illustrates a timing diagram showing a first modification to flip-flop characteristics, for use in locating synchronisers.

FIG. 4b shows the timing diagram for the circuit of FIG. 4a; all of the flip-flops characteristics have been modified. The signal Q1 illustrates the modification. All of the flip-flops have their output set to 'X' a time $T_{od}$ after their output changes. The output should remain at 'X' for a specified time $T_{xd}$. This is shown by the 'X' blocks of signal Q1 shortly after each of the rising clock edges of Clock 1.

The simulation should now be run, with the flip-flops modified. An example of the simulation results is shown in FIG. 4b. The second flip-flop FF2 has the output Q2. There are no complications with this signal, there will be no errors reported by the simulator, and so it may be assumed that it is clocked by the same clock as FF1, and is not a synchroniser. Observing the output Q3 however, there would be errors reported by the simulator as the signal will be read as an 'X'. FF3 is now metastable, and the simulation cannot continue. The signals Q4 and Q5 will now have "X" values throughout the clock period and this should result in functional failure of the circuit.

An aspect of the first step of this invention is that the flip-flops are modified to output the value 'X' shortly after each change. The length of time, labelled $T_{xd}$ in FIG. 4b, that the signal remains at 'X' must be tuned to achieve the best results. A typical value would be one-eighth of the clock period. The optimum is if the 'X' will propagate without causing errors within the same clock environment.

This method described in the last two paragraphs will identify possible synchronisers when the design is simulated. Human judgement may then be used to determine if the flip-flop in question is really a synchroniser. In another implementation of this invention the process could also be automated to decide automatically whether an identified flip-flop is a synchroniser. At this stage it is not necessary that all synchronisers have been identified as further synchronisers may be identified in the following stages. However, it is important that any identified synchronisers are indeed synchronisers; else possible errors may be unnoticed during the following stages.

The first step of this embodiment of the invention may be aided by requesting a list of known synchronisers from the circuit designer.

The next step of the present invention is to alter the characteristics of the first and second known synchronisation flip-flops. First synchronisers are altered so that they output an 'X' when metastable. Second synchronisers are altered so that they ignore the 'X' output by the first synchroniser.

Figure 5A:
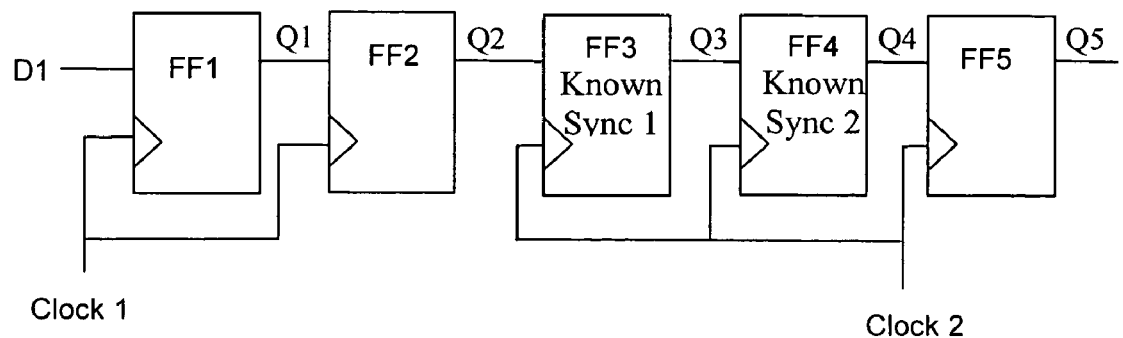
FIG. 5a illustrates the circuit of FIG. 4a in which first and second synchronisers have been identified.

FIG. 5a shows the circuit of FIG. 4a with FF3 and FF4 now shown as the known synchronisers. These flip-flops are modified such that FF3, which is the first synchroniser, outputs an 'X' for one clock period if it clocks an 'X', and the value after 'X' is different from the value before 'X'. A typical time value, labelled $T_{xm}$ in FIG. 5b, for the 'X' output of the first synchroniser when metastable would be one clock period, although this is a matter of design choice. FF4, which is the second synchroniser, ignores the 'X' output from the first synchroniser.

Figure 5B:
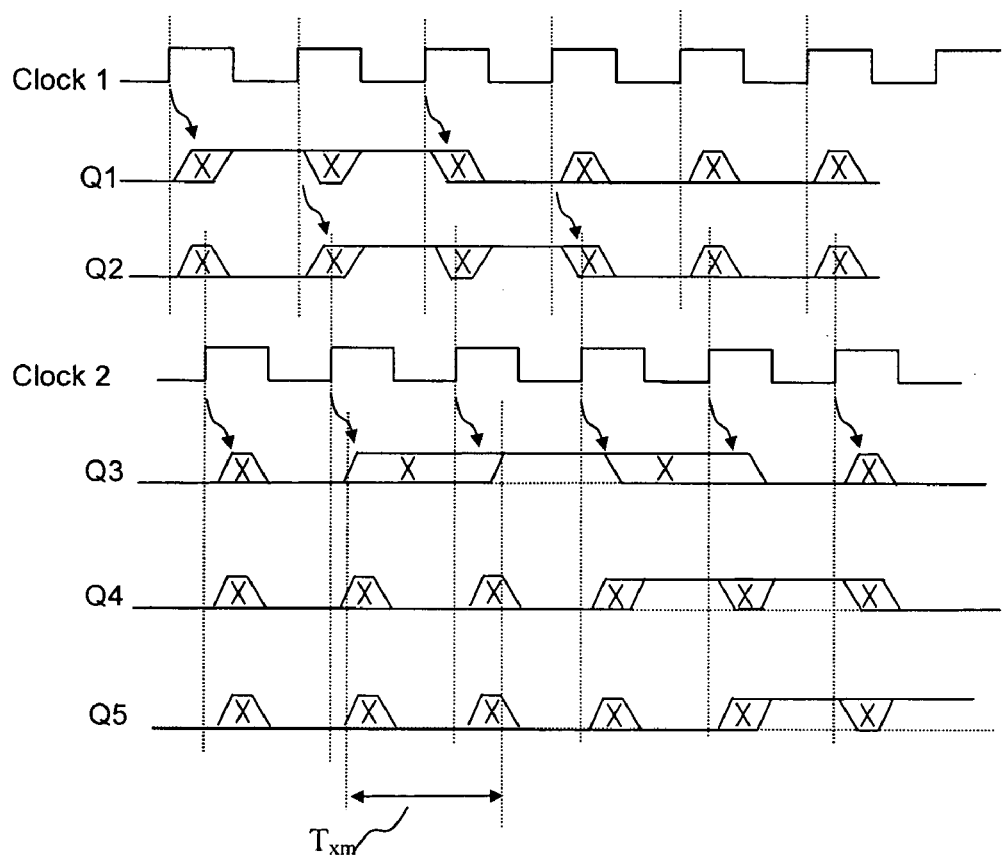

The results of simulation of the circuit after these modifications can be seen in FIG. 5b. For this simulation Clocks 1 and 2 have the same frequency, but are out of phase. Input D1 is fed a test input signal, which in this example has a value of 1 during two rising clock edges of Clock 1, and then a value of 0. This test signal is a matter of design choice, but should allow logic transitions to propagate through the circuit devices during the simulation. Q3 is the output of FF3, the first known synchroniser. On the first shown positive clock edge of Clock 2 the input to FF3 is an 'X', but the value after the 'X' is the same as the value before the 'X', which causes Q3 to become 'X' only for the predetermined delay after the clock edge. On the second shown positive edge of Clock 2 the input to FF3 is an 'X', but the value after 'X' is different from the value before the 'X', which causes Q3 to become 'X' for the remainder of the clock cycle. For subsequent positive clock edges of Clock 2, the input to FF3 will always be 'X', but only after changes does the output Q3 remain an 'X' for the whole of a clock period.

Q4 is the output of second synchroniser FF4, which has been modified to ignore the 'X' output from the first synchroniser FF3. FF4 ignores the 'X' signal generated by FF3, but continues to output an 'X' shortly after each significant clock edge of Clock 2. These known synchronisers will not cause 'X' propagation, and therefore they will not cause hazard warnings during simulation.

It should be appreciated that the circuit shown in FIG. 4a and 5a is by way of example only and embodiments of the invention can be applied to other circuit arrangements. In practice there may be a plurality of first flip-flops FF1 and combinatorial logic in the path from each first flip-flop output and the second flip-flop input. In other words, the arrangement shown in FIG. 4a is generally much simpler than that which would be used in practice.

It should be understood that this is just an example, and that this invention is by no means limited to circuits containing this type of memory storage device, but may be applied to circuits with a multitude of gate or memory types.

In embodiments of the invention, the clock environments may have similar or quite different frequencies. By way of example only, one clock environment may have a frequency of the order of 100s of MHz whilst another clock environment may have a frequency of the order of 10s of MHz.

Embodiments of the invention may be used where there are two or more clock environments. In the case of more than two clock environments, in step 1c of FIG. 3, the clocks should all have the say frequency and be out of phase by varying amounts from a first clock, and then in steps 1f and 2d, when the opposite polarity of phase difference is tested each clock should have the same frequency but opposite polarity of phase delay in relation to the first clock.

From the foregoing it will be appreciated that, although specific exemplary embodiments of the invention have been described herein for purposes of illustration, various changes and modifications may be made or suggested to one skilled in the art without deviating from the scope of the invention. Accordingly, the invention is not limited except as by the appended claims. It is intended that the present invention encompass such changes and modifications as fall within the scope of the appended claims.

What is claimed is:

1. A method of testing a circuit under design having a plurality of functional elements and having a plurality of clock environments, at least one signal passing from one clock environment to another clock environment in said circuit, said method comprising steps of:

modelling at least one of the plurality of functional elements to have an unknown state as an output for a predetermined time after a timing event of a clock signal;

simulating said circuit to identify one or more of said functional elements plurality of that is a source of propagation of said unknown state; and determining which of said plurality of functional elements is a synchronizer to thereby identify if there is a synchronization problem for said at least one signal passing from said one clock environment to said another clock environment so as to identify if a functional element which is a source of propagation of said unknown state is a hazard or a synchronizer.

2. The method as claimed in claim 1, wherein in the simulating step, a plurality of simulations are carried out with one or more of the following clock signals in said one clock environment and said another clock environment:

a) the same clock frequency and phase;
b) the same clock frequency and different phase; and
c) different clock frequencies.

3. The method as claimed in claim 1, wherein in said simulating step, said one clock environment and said another clock environment have the same clock frequency and a first phase difference.

4. The method as claimed in claim 3, wherein said simulating step is repeated with said one clock environment and said other clock environment having the same clock frequency and a second phase difference.

5. The method as claimed in claim 4, wherein said second phase difference is of opposite polarity to said first phase difference.

6. The method as claimed in claim 1, wherein in said simulating step, said one clock environment and said another clock environment have a different clock frequency.

7. The method as claimed in claim 1, wherein said determining step comprises a step of tuning the predetermined time such that the unknown state propagates through only a part of said circuit.

8. The method as claimed in claim 1, wherein said determining step comprises using warnings to identify a functional element which is a source of the unknown state and determining if said source has a synchronizing function in said circuit.

9. The method as claimed in claim 1, wherein the simulating and determining steps are repeated a plurality of times.

10. The method of claim 1, wherein said determining step is arranged to identify if a functional element which is a source of propagation of said unknown state is a hazard or a synchronizer.

11. The method as claimed in claim 1, wherein in said determining step, wherein if a functional element is determined to be a synchronizer, said functional element is arranged such that the unknown state is not propagated.

12. The method as claimed in claim 1, wherein if a first functional element and a second functional element are identified as a first synchronizer and a second synchronizer, said second synchronizer is arranged such that the unknown state is not propagated.

13. The method as claimed in claim 1, wherein said circuit is represented at gate level.

14. The method as claimed in claim 1, wherein said circuit is designed in HDL.

15. The method as claimed in claim 1, wherein said method is carried out on a simulation tool.

16. The method as claimed in claim 1, wherein said timing event comprises a clock edge.

17. The method as claimed in claim 1, wherein said plurality of functional elements comprise logic gates.

18. The method as claimed in claim 17, wherein said logic gates comprise flip-flops.

19. A method of testing a circuit under design having a plurality of functional elements and having a plurality of clock environments, at least one signal passing from one clock environment to another clock environment in said circuit, said method comprising steps of:

modelling at least one of the plurality of functional elements to have an unknown state as an output for a predetermined time after a timing event of a clock signal;

simulating said circuit; and determining which of said plurality of functional elements is a synchronizer to thereby identify if there is a synchronization problem for said at least one signal passing from said one clock environment to said another clock environment, wherein in said simulating step, said one clock environment and said another clock environment have the same clock frequency and phase.

20. A method of testing a circuit under design having a plurality of functional elements and having a plurality of clock environments, at least one signal passing from one clock environment to another clock environment in said circuit, said method comprising steps of:

modelling at least one of the plurality of functional elements to have an unknown state as an output for a predetermined time after a timing event of a clock signal;

simulating said circuit; and determining which of said plurality of functional elements is a synchronizer to thereby identify if there is a synchronization problem for said at least one signal passing from said one clock environment to said another clock environment, wherein a first element is identified as a synchronizer, comprising a step of determining propagation of an unknown state for the remainder of a clock cycle by presence of different values before and after the unknown state presented at an input of the synchronizer.

21. A computer-readable medium having a computer-executable components for a method of testing a circuit under design having a plurality of functional program and having a plurality of clock environments, at least one signal passing from one clock environment to another clock environment in said circuit, wherein, when running on a computer, said computer-executable program is configured to perform the following steps:

modelling at least one of the plurality of functional elements to have an unknown state as an output for a predetermined time after a timing event of a clock signal;

simulating said circuit to identify one or more of said plurality of functional elements that is a source of propagation of said unknown state; and determining which of said plurality of functional elements is a synchronizer to thereby identify if there is a synchronization problem for said at least one signal passing from said one clock environment to said another clock environment so as to identify if a functional element which is a source of propagation of said unknown state is a hazard or a synchronizer.

* * * * *

UNITED STATES PATENT AND TRADEMARK OFFICE
CERTIFICATE OF CORRECTION

| | | |
|---|---|---|
| PATENT NO. | : 7,159,199 B2 | Page 1 of 1 |
| APPLICATION NO. | : 10/816799 | |
| DATED | : January 2, 2007 | |
| INVENTOR(S) | : Robert Warren | |

It is certified that error appears in the above-identified patent and that said Letters Patent is hereby corrected as shown below:

Column 4, line 61, delete "if" and replace with -- 1f --;

Column 8, claim 1, line 64, insert -- plurality of -- before the term "functional" and delete "plurality of" after the term "elements".

Signed and Sealed this

Fifteenth Day of May, 2007

JON W. DUDAS
*Director of the United States Patent and Trademark Office*